United States Patent [19]

Brown

[11] Patent Number: 4,634,992
[45] Date of Patent: Jan. 6, 1987

[54] MAGNETRON AMPLIFIER POWER COMBINER

[75] Inventor: William C. Brown, Weston, Mass.

[73] Assignee: Raytheon Company, Lexington, Mass.

[21] Appl. No.: 748,784

[22] Filed: Jun. 26, 1985

[51] Int. Cl.[4] ............................ H03F 3/54; H03F 3/60
[52] U.S. Cl. .......................................... 330/47; 330/48; 330/53; 330/286; 333/17 R
[58] Field of Search ............................ 315/5.13, 39.51; 330/47, 48, 53, 286, 287; 331/5, 34; 333/17 R, 122

[56] References Cited

U.S. PATENT DOCUMENTS 3,820,035 6/1974 Meddaugh ........................... 331/5 X
3,965,434 6/1976 Helgesson ..................... 315/39.51 X Primary Examiner—Eugene R. LaRoche
Assistant Examiner—Steven J. Mottola
Attorney, Agent, or Firm—Martin M. Santa; Richard M. Sharkansky

[57] ABSTRACT

A microwave circuit for combining the high output power of two phase and amplitude controllable amplifiers (e.g. magnetron amplifiers) is described. The circuit uses a "Magic T" circuit to reduce the magnitude of the amplified power which must be dissipated by a low-power ferrite circulator connected between the input signal source and the Magic T. Phase and amplitude comparators are used to control the amplifiers so that they may be combined in the Magic T.

7 Claims, 3 Drawing Figures

MAGNETRON AMPLIFIER POWER COMBINER

BACKGROUND OF THE INVENTION

This invention relates to phase-locked magnetron amplifiers and more particularly to circuitry which combines the output power of two magnetron amplifiers each of which are controlled in amplitude and phase. Combining the power of each phase-locked magnetron as in this invention dispenses with the necessity for a high power circulator device which is interposed between the microwave driver input signal and the magnetron output power in an amplifier circuit such as that described in copending U.S. patent application Ser. No. 549,128, now abandoned, and its continuation Ser. No. 750,990, now U.S. Pat. No. 4,571,552, entitled "Phase-Locked Magnetron System" by the same Applicant and assigned to the same assignee as this application. In the circuit of the prior application, a high power ferrite circulator is required when the output power of the magnetron is high. However, the circuit losses in a high power ferrite circulator results in the generation of so much heat that it is impossible to dispose of the heat by passive radiation means in vacuum without destroying the device. The magnetron combiner described in this disclosure can operate in vacuum. Another application where the circuit of this invention may be employed is one in which higher output power is desired than is available from a single magnetron amplifier. Higher output power is obtained by combining two or more magnetron amplifiers to get the sum of their outputs without the need of a higher power circulator.

It is therefore an object of this invention to provide a high power amplifier which is phase controlled and which does not utilize a high power circulator to protect the microwave drive source. It is a feature of this invention that the microwave circuit utilized in achieving the object of this invention allows the power from a plurality of phase and amplitude controlled amplifiers to be summed thereby obtaining a greater power output than can be obtained from the individual amplifiers. It is a further feature of this invention that, because the microwave circuitry does not require a high power circulator, the phase control of the microwave amplifier can be accomplished in a low-power-dissipation environment, such as in satellite applications, where presently available circulators can function.

A specific problem solved by this invention is one relating to the peculiar requirements of the transmitter of a solar-powered satellite. In this application, it is not feasible to use a high power ferrite circulator to protect the driver in a phase-locked, high-gain magnetron directional amplifier circuit because the full power output of the magnetron has to flow through the circulator on its way to the antenna. The circulator must dissipate its loss-generated heat energy by radiation, and the ferrite materials of circulators will not operate at the high temperatures necessary for effective radiation. Under these circumstances, the use of two magnetrons working into a magic T will allow the output power of the magnetrons to flow directly into the antenna without having to go through a circulator. However, the two tubes must be very well matched in phase and amplitude by the circuit of this invention to avoid a large amount of power from being reflected to the driver through the circulator.

SUMMARY OF THE INVENTION

The aforementioned problems are overcome and other objects and advantages of this invention are provided by a microwave circuit which comprises a pair of magnetrons each of which has its input/output probe coupled to a different one of the branch arms of a "Magic T" microwave circuit. A low level microwave input signal is provided to the "H" arm of the magic T. This input signal splits equally in the Magic T and is provided as separate inputs to the probes of the magnetrons for amplification by the magnetrons. The magnetrons amplify the signal and the probes re-radiate the amplified signal down the branch arms of the Magic T circuit where they combine in the "E" arm which is connected to a load which could be an antenna feed horn, a microwave feed for slotted waveguide radiators, or some other form of microwave load. The output signal of each of the magnetrons is detected in each of the branch arms and provided as inputs to phase comparators and amplitude comparators whose outputs are provided as control signals to frequency and amplitude control terminals of each magnetron, respectively, which have the function of locking the phase of each magnetron with respect to the phase of the input signal and controlling the amplitude of each magnetron with respect to an amplitude reference signal.

BRIEF DESCRIPTION OF THE DRAWINGS

The aforementioned aspects and other features, objects and advantages of the apparatus of the present invention will be apparent from the explanation in the following description taken in conjunction with the accompanying drawings wherein.

DESCRIPTION OF THE PREFERRED EMBODIMENT

Figure 1:
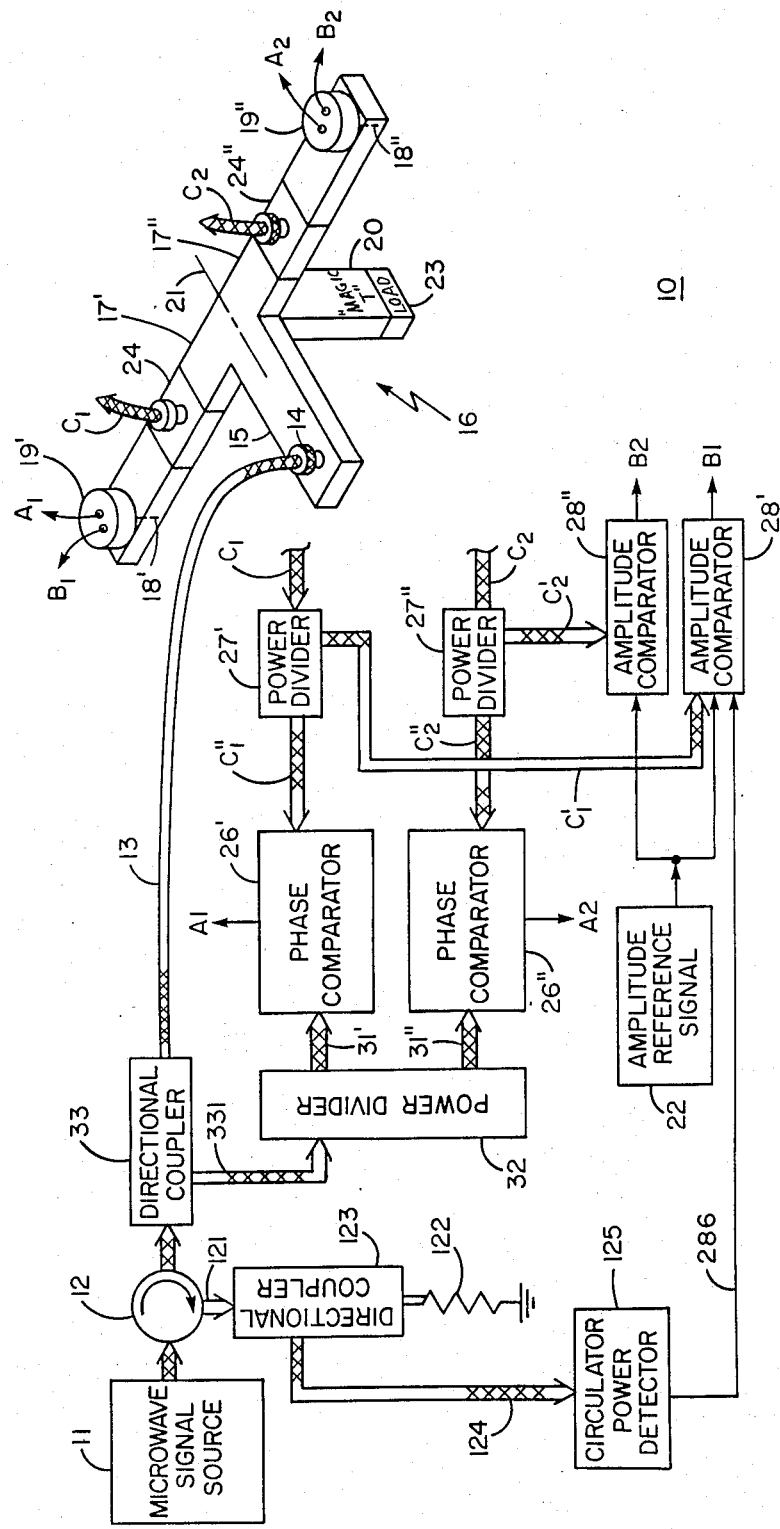
FIG. 1 is a partial block diagram and partial pictorial diagram showing the power combining circuit of this invention.

A preferred embodiment of the invention is shown in FIG. 1 where the magnetron output combiner circuit 10 is shown. A microwave signal source 11 provides a low power level (less than one watt) input to the ferrite circulator 12 which has an output which provides the input power on microwave transmission line 13 to the input probe 14 of the "H" arm 15 of the "Magic T" microwave circuit 16. The power provided by probe 14 in the arm 15 is split equally in branch arms 17', 17" of Magic T 16 where the input power is received by the RF probes 18', 18" of magnetrons 19', 19", respectively. The probes 18', 18" provide RF power to the interior of the magnetrons 19', 19" where amplification takes place. The output amplified power from each of the magnetrons 19', 19" is also provided to their RF probes 18', 18", respectively. The output RF power from each of the magnetron probes 18', 18" travels back toward the center line 21 of the arm 15 where the "E" arm 20 of Magic T 16 (also centered on centerline 21) is coupled to the amplified power in branch arms 17', 17" from each of the magnetrons 19', 19", respectively. The spacing of the magnetron probes 18', 18" from the centerline 21 differ by a quarter wavelength so that the amplified microwave power from each of the magnetrons 19', 19" is substantially in phase in the output waveguide "E" arm 20. "E" arm 20 which carries the output power from the magnetrons 19', 19" is connected to a load 23 which is typically a waveguide feed for slotted waveguide radiators, or more simply, a feed horn for an antenna.

In order that the power (ideally zero) transmitted by the magnetrons 19', 19" down the arm 15 and through microwave transmission line 13 to the ferrite circulator 12 not exceed the power limitation of the circulator 12, it is necessary to control the amplitude and phase of the output power of magnetrons 19', 19" so that they are of equal power and inphase in arm 20. Therefore, the output power from each magnetron is sampled by directional couplers 24', 24" in branch arms 17', 17" equidistant from centerline 21. The low power outputs (typically 50 dB) of directional couplers 24', 24" are connected to RF output microwave transmission lines $C_1$, $C_2$ whose power is split by 3 dB power dividers 27', 27" which are connected via RF microwave transmission lines $C_1'$, $C_2'$ to amplitude comparators 28', 28", respectively.

The microwave signals in lines $C_1''$ and $C_2''$ (the outputs of power dividers 27', 27") are also applied as inputs to the phase comparators 26', 26", respectively. The other inputs to the phase comparators 26', 26" is provided by the output signals on lines 31', 31", respectively, of the 3 dB power divider 32. The divider 32 input is connected by line 331 to the directional coupler 33 low level output (typically 10 dB) which samples the microwave drive signal from source 11 and circulator 12 in line 13. Directional coupler 33 discriminates against the signal in line 13 which travels from the probe 14 to circulator 12. Therefore, line 331 primarily contains the input signal from source 11 and only a much smaller signal from the arm 15 resulting from phase or amplitude mismatch of magnetrons 19', 19". The direct current signal outputs $A_1$, $A_2$ of the phase comparators 26', 26", respectively, are applied as phase-control inputs to the correspondingly labelled inputs of magnetrons 19', 19" to phase-lock the magnetrons output signals on lines $C_1$, $C_2$ to the respective signals on lines 31', 31" (which are fixed in phase with respect to the input signal from source 11).

Figure 2:
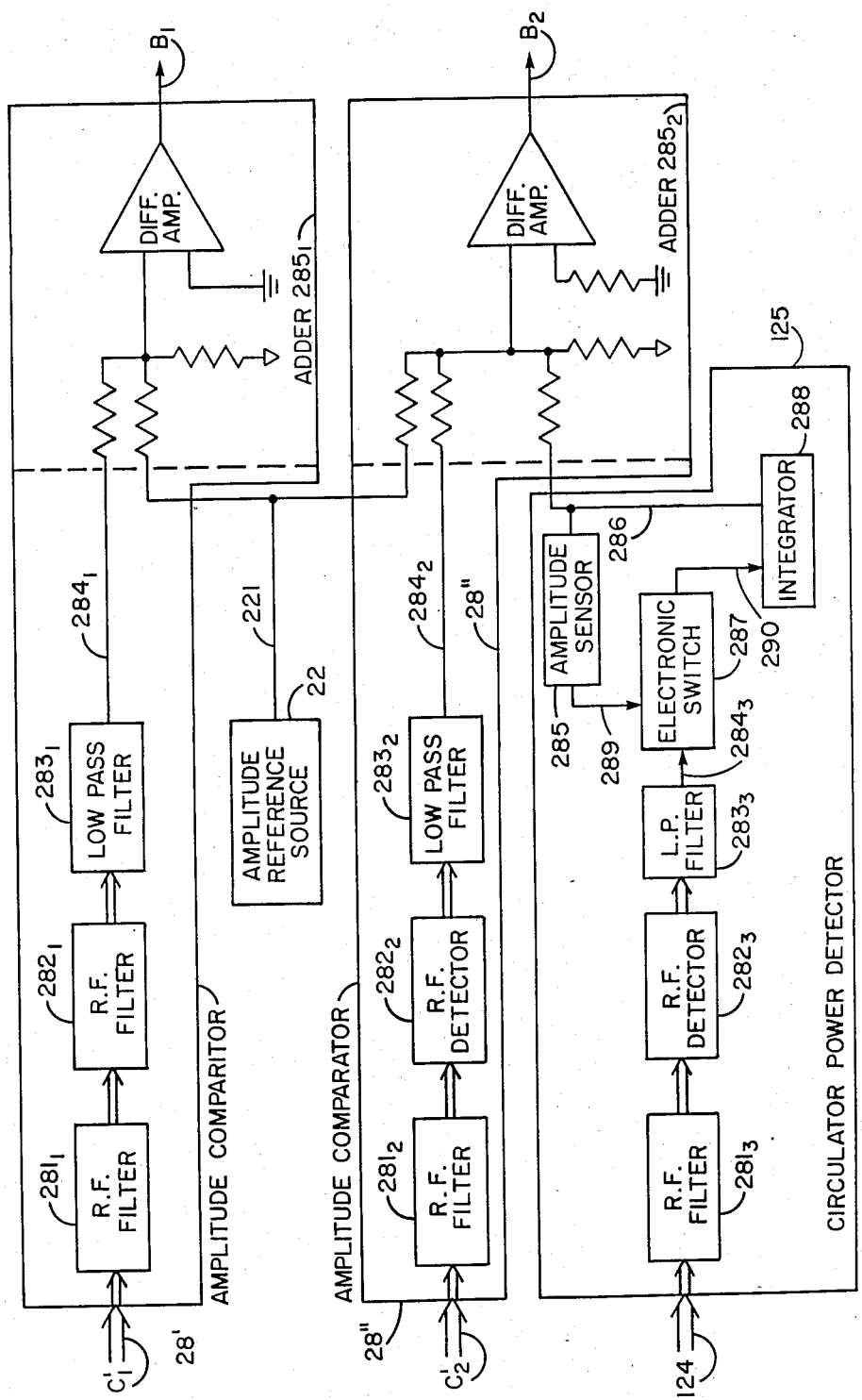
FIG. 2 is a schematic of the amplitude comparison circuits of FIG. 1.

The RF signals on lines $C_1'$, $C_2'$ (the other outputs of power dividers 27', 27") are applied as inputs to the amplitude comparators 28', 28", respectively, shown in detail in FIG. 2. An amplitude reference source 22 provides a DC voltage to each of the amplitude comparison circuits 28', 28" which compares the signals on lines $C_1'$, $C_2'$ after rectification to provide error signals on lines $B_1$ and $B_2$, respectively. The DC signals on lines $B_1$ and $B_2$ are provided to corresponding lines of magnetrons 19', 19" and are used to control the amplitude of the output signals of the magnetrons 19', 19", respectively. The manner in which the amplitude is controlled is presented in conjunction with the description of the magnetron 19 of FIG. 3.

Because the output amplitudes of magnetrons 19', 19" are very large, they must be well matched to avoid excessive power flow back into arm 15 of the Magic T which will be transmitted to the load 122 on the circulator 12. The power flow into load 122 is monitored through a directional coupler 123 and can be used to compensate for any small difference in the calibration of the directional couplers 24', 24" and their failure to monitor with equal ratio the power flow in arms 17', 17" of the Magic T.

A small fraction, typically 10%, of the power in load 122 is provided by the 10 dB coupler 123 to the RF line 124 to the circulator power detector 125 which provides an output DC signal on line 286 to the adder $285_1$, $285_2$ portion of either one of the amplitude comparators 28', 28" (comparator 28" is used in FIG. 2). The circulator power detector 125 provides an additional DC input to adder $285_2$ to increase or decrease the power output of the magnetron 19" to thereby minimize the power transmitted to circulator 12 by the magnetrons 19', 19".

Referring now to FIG. 2, there are shown block diagrams of the amplitude comparators 28', 28" and the circulator power detector 125. The RF signals on line $C_1'$ is applied to an RF filter $281_1$ before being detected in the RF detector $282_1$ whose rectified output is filtered in a low-pass filter $283_1$ to provide a DC signal on line $284_1$. Line $284_1$ is applied as one input to the conventional adder circuit $285_1$ comprising a resistor input network which is connected to one input of a differential amplifier. The other input to the adder $285_1$ is provided by the DC signal on line 221 of the amplitude reference source 22. The output DC signal on line $B_1$ controls the amplitude of the RF output of magnetron 19' to cause the detected RF signal of line $C_1'$ to be equal to the DC output on line 221 of the amplitude reference signal source 22.

The RF signal on line $C_2'$ is applied to amplitude comparator 28" having RF filter $281_2$, RF detector $282_2$ and lowpass filter $283_2$ which are serially connected to provide a DC signal on line $284_2$ which is provided as one input of adder $285_2$. Another input to adder $285_2$ is provided by the amplitude reference signal 22 on line 221. The DC signals on lines 221, $284_2$ would provide an output DC signal on line $B_2$ which would cause the output power of magnetron 19" to be equal to that of magnetron 19' except for the small differences in directional couplers 24', 24".

An additional DC input to the adder $285_2$ is required to cause the DC voltage on line $B_2$ to be of the correct magnitude to cause the output power of the magnetrons 19', 19" as seen by the circulator 12 to be minimized. The RF signal on line 124 from directional coupler 123 and circulator 12 is applied to the circulator power detector 125. Detector 125 has an RF filter $281_3$, RF detector $282_3$ and low-pass filter $283_3$ which provides a DC signal on line $284_3$ whose absolute value is dependent upon the power in circulator 12. The polarity of the signal on line $284_3$ is dependent upon the polarity produced by the RF detector $282_3$.

The DC output signal on line $284_3$, assumed to be of positive polarity, is applied to an electronic switch 287 which is actuated by the occurrence of pulses on line 289 to change, at each pulse occurrence, the polarity of the output signal on line 290 of switch 287 which is of the same magnitude as the DC signal on line $284_3$. The signal on line 290 is applied as an input to integrator 288 whose DC output on line 286 is applied as an input to adder $285_2$ and as an input to amplitude sensor 285. Amplitude sensor 285 is a circuit designed to produce a pulse on its output line 289 when its input, the DC output voltage of integrator 288, reaches predetermined high and low voltage limits. Thus, for example, it is assumed that the voltage on line 290 is a small positive voltage which causes the output voltage of integrator 288 and on line $B_2$ to increase and to thereby increase the output power of magnetron 19". An increase in magnetron 19" power may be the correct direction of change to minimize circulator 12 power in which case the voltage on line 290 will decrease in magnitude and cause the integrator 288 to provide a steady DC signal on line 286 of the proper value to result in a voltage on line $B_2$ of the value which causes magnetron 19" to produce the amount of power required to minimize the power in circulator 12.

On the other hand, if the increase in magnetron 19" power causes the voltage on line 290 to increase, the integrator 289 output voltage will continue to increase until the upper voltage limit of amplitude sensor 285 is reached thereby producing a pulse on its output line 289 which causes switch 287 to change its output on line 290 to a negative polarity (but not change the amplitude). The negative input voltage to integrator 288 causes its output voltage on line 286 to fall thereby reducing the output power of magnetron 19" to the level required to minimize the power in circulator 12.

Alternatively, the lower limit of amplitude sensor 285 input voltage is reached when the negative voltage on line 290 to integrator 288 is increased in magnitude by the reduction of power of magnetron 19" caused by the increasingly negative voltage on line $B_1$. The pulse on line 289 produced when the lower limit of sensor 285 is reached causes switch 287 to change the polarity of the voltage on line 290 to positive to thereby cause the magnetron 19" power to increase to a value which minimizes the power in circulator 12.

It is assumed in the above explanation that minimization of the power in circulator 12 is achievable by the change in the output power of magnetron 19" produced by the voltage range between the allowable upper and lower limits of integrator 288 output voltage.

Alternatively, if automatic operation is not desired, switch 287, integrator 288 and sensor 285 are not needed. The power in circulator 12 may be minimized by manually adjusting a potentiometer (not shown) to apply a positive or negative voltage of variable amplitude to line 286 to increase or decrease the power of magnetron 19" to thereby minimize the voltage on line $284_3$ (and consequently to minimize the power in circulator 12).

Figure 3:
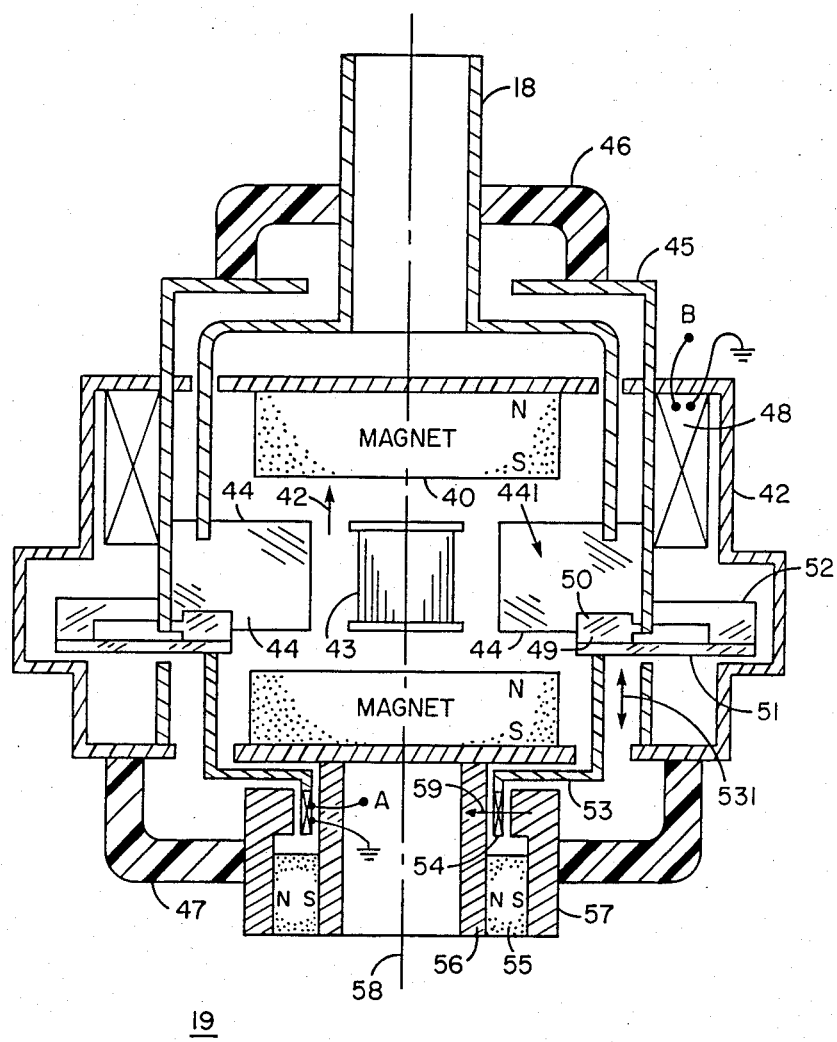
FIG. 3 is a longitudinal cross-sectional view of the magnetron of FIG. 1.

FIG. 3 shows a longitudinal cross-sectional view of a magnetron 19, typically the magnetrons 19', 19" of FIG. 1, to which DC signals on lines A, B may be applied for the control of the amplitude and phase, respectively, of the RF power output of the magnetron. The magnetron 19 comprises magnets 40, 41 which are polarized to provide a magnetic field M in the direction 42 which provides a field transverse to the direction of electrons (not shown) which leave the cathode 43 and terminate on the vanes 44. The vanes 44 form part of the anode 441 which includes the copper shell 45 attached to the periphery of the vanes 44. The return path for the magnetic field produced by the magnets 40, 41 is provided by the steel casing 42 which comprises much of the exterior portion of the magnetron 19. The electrically conducting probe 18 is connected to the vanes 44 through the casing 42 at appropriate locations to couple the energy contained in the cavities between the vanes 44. Ceramic seals 46, 47 seal the probe 18, shell 45, and casing 42 to maintain a vacuum within the magnetron interior. A buck-boost magnet coil 48 has a terminal on line B by which it is electrically connected to the terminal $B_1$ or $B_2$ of magnetrons 19', 19", respectively, of the circuit of FIG. 1. The DC voltage provided to the terminals on lines $B_1$ or $B_2$ by circuit 30 changes the amplitude of magnetic field M which in turn causes the magnetron anode current in the high voltage supply (not shown) connected between the cathode 43 and the anode 441 to change and thereby change the power output of the magnetron.

Also included in the magnetron 19 is an inductive tuner 49 which comprises planar copper plates 50 which are each attached to a cantilever spring 51 and a support structure 52 fastened to the copper shell 45. The plates 50 controllably extend partially into the cavities between the vanes 44 and inductively tune the cavities. The plates 50 are attached to the movable ends 51' of the springs 51. Also attached to the end 51' is a rigid arm 53 which also supports a coil 54. Coil 54 is located in the magnetic field produced by the permanent magnet 55 and the magnetic legs 56, 57 which direct a magnetic field 59 in the direction of the plane of the coil 54. Electrical connection to the coil 54 is made through a terminal of line A which corresponds to terminals $A_1$ or $A_2$ of magnetrons 19', 19" of FIG. 1. DC current provided to coil 54 by phase comparators 26', 26" causes the magnetic field 59 produced by the magnet 55 to produce a force upon the coil 54 in the axial direction 58. This force is transmitted through the arms 53 to the plates 50 against the restraining force provide by the springs 51 to cause the plates 50 to be axially translated in the cavities between the vanes 44 along direction line 531 depending upon the polarity and magnitude of the current provided through the coil 54 by the phase comparators 26', 26" connected to magnetrons 19', 19", respectively. The effect of changing the longitudinal position of the plate 50 upon the magnetron 19 operation is primarily to change the phase of the magnetron output power relative to the input signal phase at probe 18 while having only a secondary effect with respect to the magnitude of the output power.

Although the invention has been described by using a specific tube, namely a frequency tunable and amplitude controllable magnetron, it should be understood that the invention is not so limited. Any radio frequency or microwave frequency amplifier possessing these characteristics may be used instead of a magnetron. Similarly, the directional couplers 27', 27" connected between the phase comparators 26', 26" and the amplitude comparator 28 may be replaced by a power divider such as the 3 dB power divider 32. It is further recognized that because of the symmetry of the "E" and "H" arms of the Magic T microwave circuit, they may be interchanged in the preferred embodiment. Also, because of the symmetry of the Magic T, the amplifiers may be in the "E" and "H" arms, respectively, while the branch arms contain the probe 14 and load 23, respectively.

What is claimed is:

1. A power combining circuit comprising:
   a first and second frequency tunable and amplitude controllable amplifier, each having an input and an output;
   a source of a microwave input signal;
   a microwave load;
   a microwave circuit connecting said first and second amplifier inputs to said input signal source and connecting said first and second amplifier outputs to said load and to said signal source, said first and second amplifier outputs being in-phase at said load and out-of-phase at said connection to said signal source;
   means responsive to the output of each of said first and second amplifiers and to said input signal to provide phase error signals to control the frequency of said first and second amplifiers, respectively, to minimize said error signals; and means responsive to the output amplitude of each of said first and second amplifiers to provide first and second amplitude signals to control the amplitude of said first and second amplifier outputs, respectively, to be equal to each other.

2. The power combining circuit of claim 1 comprising in addition:

a circulator connected between said source and said microwave circuit;

a circulator power detector; and wherein said means responsive to the output amplitudes of each of said first and second amplifiers comprises a directional coupler connected to the output of said circulator and the input of said circulator power detector.

3. A power combining circuit comprising:

first and second magnetrons;

a microwave "Magic T" component having first and second branch arms, an "H" arm, and an "E" arm;

a microwave signal source;

a circulator;

a first and second phase comparator;

a first and second amplitude comparator;

said first and second magnetrons being electrically connected to receive and transmit power to and from said first and second branch arms, respectively;

said signal source being connected to provide an input signal to said microwave component in one of said "H" and "E" arms;

first and second power dividers;

a first and second directional coupler in each branch arm to provide a first and second signal from said first and second magnetrons to said first and second power dividers, respectively;

said first and second power dividers each providing input signals to said first and second amplitude comparators and to said first and second phase comparators, respectively;

a third directional coupler providing third and fourth signals from said signal source input to said first and second phase comparators;

each of said first and second magnetrons having a phase control and an amplitude control;

the output of said first and second phase comparators being provided to the phase control of said first and second magnetrons, respectively;

an amplitude reference signal also provided as inputs to said first and second amplitude comparators;

means for detecting the power in said circulator produced by the outputs of said first and second magnetrons to provide a detected signal;

means for providing said detected signal to one of said amplitude comparators as another input signal;

the outputs of said first and second amplitude comparators being provided to the amplitude controls of said first and second magnetrons; and a load connected to the other of said "H" and "E" arms through which the in-phase and equal-amplitude output power of the magnetrons is transmitted.

4. The power combining circuit of claim 3 wherein:

said third directional coupler is connected between said microwave component and said signal source;

said means for detecting the power in said circulator comprises:

a fourth directional coupler;

a circulator power detector; and said fourth coupler and power detector being serially connected between said circulator and said first amplitude comparator.

5. A power combining circuit comprising:

a first and second frequency tunable and amplitude controllable amplifier, each having an input and an output;

a "Magic T" microwave component having a first pair of branch arms, and a second pair consisting of an "E" arm and an "H" arm;

said first and second amplifier input and output being connected to a different arm of one pair;

a microwave input signal provided to an input in one arm of the other pair of arms and provided thereby to the arms to which said first and second amplifiers are connected;

a microwave signal source;

a microwave isolating circuit connected between said signal source and said arm input;

means providing the microwave output signals of each amplifier from each of said arms of said one pair;

means responsive to the amplitude difference of the output signals of said first and second amplifiers to provide at least one amplitude error signal, respectively;

each of said first and second amplifiers having frequency controlling means and amplitude controlling means;

means applying said amplitude error signal to the amplitude controlling means of one of at least one said amplifiers to minimize said amplitude error signal;

means responsive to the phase differences of said input signal with respect to the output signals of said first and second amplifiers to provide a first and second phase error signal to said first and second amplifier frequency controlling means, respectively, to minimize said first and second phase error signal; and a load connected to the other arm of the other pair of arms.

6. The power combining circuit of claim 5 wherein said means providing the microwave output signals of each amplifier from each of said arms of said one pair comprises:

a first and second directional coupler connected between said first and second amplifiers, respectively, and the junction of said first and second pairs of arms;

said means responsive to the phase differences comprising a first and second phase difference responsive means; and a low power output terminal of each of said first and second directional couplers being connected to said first and second phase difference responsive means, respectively, and also being connected to said amplitude difference responsive means.

7. The power combining circuit of claim 5 wherein said means responsive to the amplitude difference of output signals of said first and second amplifiers to provide an amplitude error signal comprises:

a first and second amplitude comparison means;

an amplitude reference signal applied as one input to said first and second amplitude comparision means;

the output signal of said first and second amplifiers being provided as a second input to said first and second comparison means, respectively;

a portion of said output power being applied as a third input to one of said comparison means;

said first and second comparison means providing first and second error signals to said first and second amplifier amplitude controlling means, respectively.

* * * * *